United States Patent [19]
Togami et al.

[11] Patent Number: 6,081,474
[45] Date of Patent: Jun. 27, 2000

[54] SEMICONDUCTOR MEMORY

[75] Inventors: Tetsuji Togami; Kazuteru Suzuki, both of Tokyo, Japan

[73] Assignee: NEC Corporation, Tokyo, Japan

[21] Appl. No.: 09/156,615

[22] Filed: Sep. 18, 1998

[30] Foreign Application Priority Data

Sep. 18, 1997 [JP] Japan .................................. 9-253228

[51] Int. Cl.[7] .................................................. G11C 8/00
[52] U.S. Cl. .............................. 365/230.03; 365/230.01; 365/230.06; 365/231; 365/185.16; 365/185.11; 365/185.17
[58] Field of Search ....................... 365/230.06, 230.01, 365/230.03, 185.16, 185.11, 185.17, 231

[56] References Cited

U.S. PATENT DOCUMENTS

| | | |
|---|---|---|
| 5,268,861 | 12/1993 | Hotta . |
| 5,392,233 | 2/1995 | Iwase ........................................ 365/104 |
| 5,590,068 | 12/1996 | Bergemont ................................ 365/63 |
| 5,621,697 | 4/1997 | Weng et al. .......................... 365/230.06 |
| 5,726,929 | 3/1998 | Suminaga et al. ....................... 365/104 |
| 5,825,683 | 10/1998 | Chang ..................................... 365/104 |
| 5,875,128 | 2/1999 | Ishizuka .............................. 365/185.06 |
| 5,909,405 | 6/1999 | Lee et al. ............................ 365/230.03 |

FOREIGN PATENT DOCUMENTS

| | | |
|---|---|---|
| 4-311900 | 11/1992 | Japan . |
| 5-167042 | 7/1993 | Japan . |
| 6-44778 | 2/1994 | Japan . |

*Primary Examiner*—Viet Q. Nguyen
*Attorney, Agent, or Firm*—Sughrue, Mion, Zinn, Macpeak & Seas, PLLC

[57] ABSTRACT

In a semiconductor memory, four bit line diffused interconnections 1 connected to two bit line terminals D0 and D1 through bank selection transistors BT1 and BT2 are connected to drains of memory cells of four column pairs, respectively, and four bit line diffused interconnections 2 connected to one virtual ground line terminal VG1 through bank selection transistors BT3 to BT6 are connected to sources of memory cells of the four column pairs. The bank selection transistors BT1 to BT6 are so located that each of the bit line diffused interconnections 1 is connected to a corresponding one of the bit line terminals D0 and D1 through only one bank selection transistor and each of bit line diffused interconnections 2 is connected to the virtual ground line terminal VG1 through only one bank selection transistor. Thus, data can be surely read from a selected memory cell at a high speed. At the time of elevating the integrated density, it is easy to locate and pattern metal interconnections connected to the bit line terminal and the virtual ground line terminal.

6 Claims, 8 Drawing Sheets

SEMICONDUCTOR MEMORY

BACKGROUND OF THE INVENTION

1. Field of the Invention

The present invention relates to a semiconductor memory such as a ROM (read only memory) and an EEPROM (electrically erasable programmable ROM) having a number of memory cells arranged in the form of a matrix, and more specifically to a semiconductor memory required to precharge a memory cell array at the time of reading a cell data.

2. Description of Related Art

In this type of semiconductor memory required to carrying out a precharge at the time of reading a cell data, it is a general practice to precharge bit lines of the cell array. This precharge is performed for a bit line diffused interconnection of each memory cell. When a reading is carried out, virtual ground lines are discharged, so that the diffused interconnection connected to a selected virtual ground line is discharged.

Referring to FIG. 6, there is shown a circuit diagram of this type of semiconductor memory in the prior art. In FIG. 6, Reference Signs D1 to D3 designate bit line terminals each connected to a not-shown sense amplifier, and Reference Signs WS1 to WSn denote word lines. Reference Signs BS1 to BS6 indicate bank selection lines, and Reference Signs VG1 to VG4 show virtual ground line terminals. Reference Signs BT1 to BT6 designate bank selection transistors, and Reference Sign SARY denotes a memory cell array. This memory cell array SARY includes a number of memory cells, which are arranged in the form of a matrix, and some of which are designated with Reference Signs SX1, SX2, SY1 to SY8.

In the semiconductor memory shown in FIG. 6, when data is read out from the memory cell SX1, a sense amplifier current is supplied to the bit line terminal D1 from the sense amplifier, and a corresponding upper side bank selection line(s) BS is selected to turn on the bank selection transistors BT connected to the selected bank selection line(s) BS, so that the sense amplifier current is supplied through an internal bit line diffused interconnection 1 (first sub-bit line) to a drain of a selected memory cell SX1. On the other hand, one row of memory cells including the memory cell SX1 are selected by the word line WSn, and a corresponding lower side bank selection(s) line BS is selected to turn on the bank selection transistors BT connected to the selected bank selection line(s) BS, so that data is read out from a source of the selected memory cell SX1 through an internal bit line diffused interconnection 2 (second sub-bit line) and the virtual ground line terminal VG1. At this time, the bit line terminal D2 and the virtual ground line terminal VG2 positioned at a drain side of the selected memory cell SX1 have been precharged.

Referring to FIG. 7, there is shown a circuit diagram of the semiconductor memory disclosed in Japanese Patent Application Pre-examination Publication No. JP-A-4-311900 and its corresponding U.S. Pat. No. 5,268,861 (the content of which is incorporated by reference in its entirety into this application). In FIG. 7, elements similar to those shown in FIG. 6 are given the same Reference Signs, and explanation thereof will be omitted for simplification of the description.

This semiconductor memory is so configured that two bank selection lines BS1 and BS2 are located at an upper side of the memory cell array SARY, and two bank selection lines BS3 and BS4 are located at a lower side of the memory cell array SARY. Two bit line diffused interconnections 1 are connected through the bank selection transistors BT1 and BT2 to one bit line terminal D and each of the bit line diffused interconnections 1 is connected to a drain of memory cells included in a pair of adjacent columns in the memory cell array SARY, and two bit line diffused interconnections 2 are connected through the bank selection transistors BT3 and BT4 to one virtual ground line terminal VG and each of the bit line diffused interconnections 2 is connected to a source of memory cells included in a pair of adjacent columns in the memory cell array SARY.

In the prior art semiconductor memory circuit shown in FIG. 6, when data is read out from the memory cell SX1 in an ON condition, if an adjacent memory cell SX2 is in an ON condition, a sense amplifier current ③ from the bit line terminal D1 and a circulating current ② from the precharged virtual ground line VG2, are supplied to the drain of the memory cell SX1. Here, when the selected memory cell SX1 is positioned remote from the bit line terminal D1 but near to the virtual ground line VG2, assuming that the resistance of the whole of the bit line diffused interconnections in one path from the bit line terminal D to the virtual ground line terminal VG is "R" as shown in an equivalent circuit shown in FIG. 8, the resistance "R-R1" of the bit line diffused interconnection 2 from the virtual ground line VG2 is smaller than the resistance "R1" of the bit line diffused interconnection 1 from the bit line terminal D1, and therefore, the circulating current ② becomes larger than the sense amplifier current ①. As a result, a sufficient sense amplifier current does not flow through the selected sense amplifier SX1, and therefore, when the data is read out at the virtual ground line terminal VG1, an erroneous data is read out. This is a problem. Furthermore, when data is read from the memory cell SX1 in the ON condition, since three transistors BT2, BT4 and BT6 exist between the bit line terminal D1 and the virtual ground line terminal VG1, the sense amplifier current lowers, with the result that an erroneous data is read out. This is also a problem.

In addition, for example, when data is read out from the memory cell SY1, the sense amplifier current is supplied to the bit line terminal D2, and data is read from the virtual ground line terminal VG2. At this time, the bit line terminal D3 and the virtual ground line terminal VG3 are precharged. In this case, assuming that the memory cells SY1 and SY8 are in an OFF condition and the memory cells SY2 to SY7 are in an ON condition, since a precharge current ⑤ from the virtual ground line VG3 is cut off at the memory cell SY8, diffused layers "A" to "F" must be charged with a sense amplifier current ④ from the bit line terminal D2. Therefore, the time constant at the data reading time becomes large, with the result that a data reading speed becomes low. This is also a problem.

On the other hand, the prior art semiconductor memory shown in FIG. 7 can solve, at some degree, the problems of the data erroneous reading and the lowered data reading speed in the prior art semiconductor memory shown in FIG. 6. However, since the bank selection is in the four-stage construction, the prior art semiconductor memory shown in FIG. 7 cannot be applied to a bank selection construction having more than four stages.

In general, in a semiconductor memory, a drain and a source of each memory cell are formed of a diffused layer similar to the internal bit line diffused interconnections 1 and 2, and a gate of each memory cell is formed of a polysilicon. In addition, a drain and a source of each bank selection transistor are formed of a diffused layer, and a gate of each bank selection transistor is formed of a polysilicon. The word lines and the bank selection lines connected to the gate of the memory cells and the gate of the bank selection transistors are formed of a polysilicon. Namely, in FIG. 9 illustrating a layout of the prior art semiconductor memory shown in FIG. 7, "BN" shows a diffused layer such as the bit line diffused interconnection, and "WS" indicates a polysilicon such as the word line. "Al" denotes an aluminum interconnection connected to the bit line terminal D or the virtual ground line terminal VG.

Here, as shown in FIG. 9, a minimum width of the diffused layer BN has a limit of 0.5 μm, and a minimum spacing between adjacent diffused layers BN has a limit of 0.5 μm Therefore, a minimum locating pitch of the diffused layers BN has a limit of 1.0 μm In the prior art semiconductor memory shown in FIG. 7, for the bit line terminals and the virtual ground line terminals, it is necessary to provide one aluminum interconnection for each two diffused layers. Therefore, even if it is attempted to increase the integration density by minimizing the locating pitch of the diffused layers BN, the integration density is limited by the locating pitch of the aluminum interconnections. Namely, assuming that the minimum locating pitch of the diffused layers BN is 1.0 μm, the locating pitch of the aluminum interconnection "Al" connected to either the bit line terminal D or the virtual ground line terminal VG, becomes 2.0 μm, as shown in FIG. 9. This means that the line width and the locating spacing of the aluminum interconnection "Al" become 1 μm. Under this condition, it is difficult to locate and pattern the aluminum interconnection.

SUMMARY OF THE INVENTION

Accordingly, it is an object of the present invention to provide a semiconductor memory which has overcome the above mentioned defects of the conventional ones.

Another object of the present invention is to provide a semiconductor memory capable of surely reading data from a selected memory cell at a high speed.

Still another object of the present invention is to provide a semiconductor memory capable of making it easy to locate and pattern metal interconnections such as aluminum interconnections connected to a bit line terminal and a virtual ground line terminal at the time of elevating the integrated density.

The above and other objects of the present invention are achieved in accordance with the present invention by a semiconductor memory comprising:

a memory cell array including a number of memory cells located in the form of a matrix;

a plurality of bit line terminals for supplying a sense amplifier current to one electrode of a pair of electrodes of each of the memory cells arranged in a column direction;

a plurality of ground line terminals for reading data from the other electrode of each of the memory cells arranged in a column direction;

a plurality of word lines each connected in common to gates of the memory cells arranged in a row direction;

a plurality of first sub-bit lines to be connected to the bit line terminals and individually connected to the one electrode of the memory cells;

a plurality of second sub-bit lines each to be connected to the ground line terminals and individually connected to the other electrode of the memory having the one electrode connected to the first sub-bit lines; and a plurality of bank selection transistors connected between the bit line terminals and the ground line terminals and the first sub-it lines and the second sub-bit lines, and selectively turned on by bank selection signals, the number of the first sub-bit lines connected to one of the bit line terminals being different from the number of the second sub-bit lines connected to one of the ground line terminals.

In an embodiment, the number of the first sub-bit lines connected to one of the bit line terminals is a double of the number of the second sub-bit lines connected to one of the ground line terminals.

In another embodiment, the number of the first sub-bit lines connected to one of the bit line terminals is a half of the number of the second sub-bit lines connected to one of the ground line terminals.

Specifically, each of the first sub-bit lines is connected to a corresponding one of the bit line terminals through only one bank selection transistor, and each of the second sub-bit lines is connected to a corresponding one of the ground line terminals through only one bank selection transistor.

The first and second sub-bit lines, the one electrode and the other electrode of each of the memory cells, and one electrode and the other electrode of each of the bank selection transistors are formed of a diffused layer, the gate of each of the memory cells and the bank selection transistors, bank selection lines connected to the gates of the bank selection transistors and the word lines are formed of a polysilicon.

Bit lines and ground lines connected to the bit line terminals and the ground line terminals, respectively, are formed of a metal interconnection.

The above and other objects, features and advantages of the present invention will be apparent from the following description of preferred embodiments of the invention with reference to the accompanying drawings.

DESCRIPTION OF THE PREFERRED EMBODIMENTS

Now, the present invention will be described with reference to the drawings.

Figure 1:
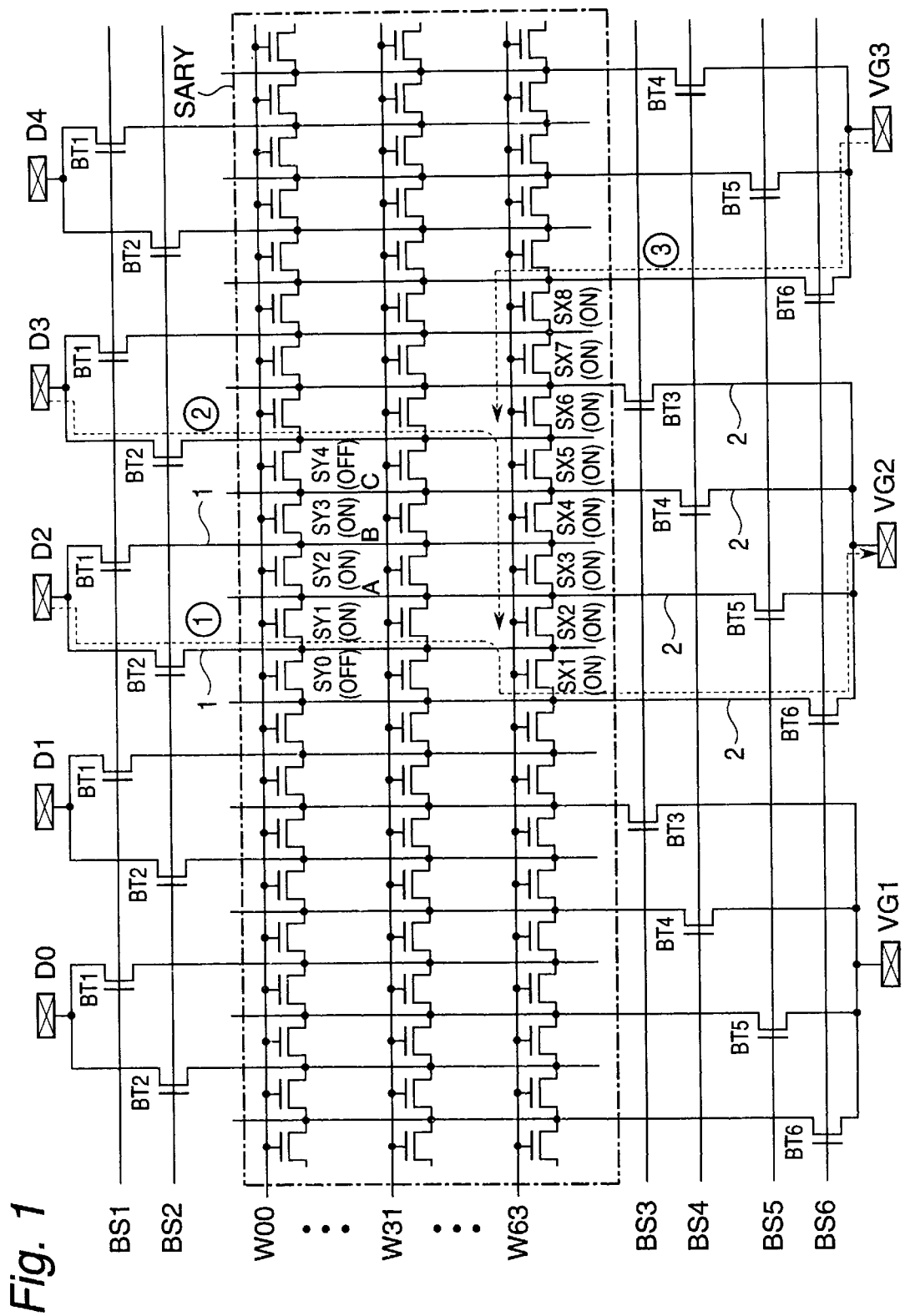
FIG. 1 is a circuit diagram of a first embodiment of the semiconductor memory in accordance with the present invention.

Referring to FIG. 1, there is shown a circuit diagram of a first embodiment of the semiconductor memory in accordance with the present invention. In FIG. 1, Reference Signs D1 to D4 designate bit line terminals, and Reference Signs W00 to W63 denote word lines. Reference Signs BS1 to BS6 indicate bank selection lines, and Reference Signs VG1 to VG3 show virtual ground line terminals. Reference Signs BT1 to BT6 designate bank selection transistors, and Reference Sign SARY denotes a memory cell array. This memory cell array SARY includes a number of memory cells, which are arranged in the form of a matrix, and each of which is formed of a MOS transistor, and some of which are designated with Reference Signs SX1 to SX8, SY0 to SY4.

Here, a source and a drain of each of the memory cells and the bank selection transistors are formed of a diffused layer, and a gate of each of the memory cells and the bank selection transistors is formed of a polysilicon. The word lines W00 to W63 and the bank selection lines BS1 to BS6 for controlling the respective gate currents of the memory cells and the bank selection transistors are also formed of a polysilicon.

On the other hand, each of the bit line terminals D0 to D4 is connected to a not-shown sense amplifier and connected to an aluminum interconnection Al (bit line) described hereinafter. Each of the bit line terminals D0 to D4 is connected through the bank selection transistor BT1 or BT2 and one bit line diffused interconnection 1 (first sub-bit line) to respective drains of the memory cells of a corresponding column pair in the memory cell array SARY. Each of the virtual ground line terminals VG1 to VG3 is connected to an aluminum interconnection Al (ground line) and connected through one of the bank selection transistor BT3 to BT6 and one bit line diffused interconnection 2 (second sub-bit line) to respective sources of the memory cells of the corresponding column pair in the memory cell array SARY.

In the semiconductor memory shown in FIG. 1, when data is read out from the memory cell SX1, a sense amplifier current is supplied to the bit line terminal D2 from the sense amplifier, and a corresponding upper side bank selection line BS2 is selected to turn on the bank selection transistors BT2, so that the sense amplifier current ① is supplied through the internal bit line diffused interconnection 1 (first sub-bit line) to a drain of the selected memory cell SX1. On the other hand, one row of memory cells including the memory cell SX1 are selected by the word line W63, and a corresponding lower side bank selection line BS6 is selected to turn on the bank selection transistors BT6, so that data is read out from a source of the selected memory cell SX1 through the internal bit line diffused interconnection 2 (second sub-bit line) and the virtual ground line terminal VG2. At this time, the bit line terminal D3 and the virtual ground line terminal VG3 positioned at a drain side of the selected memory cell SX1 have been precharged.

In FIG. 1, when data is read from the memory cell SX1 in an ON condition, if the memory cells SX2 to SX8 adjacent to the drain side (the precharge side) of the selected memory cell SX1 in a row direction are also in the ON condition, a circulating current ② flows from the precharged bit line terminal D3 through the turned-on transistor BT2 and also through the memory cell SX5, the memory cell SX4, the memory cell SX3 and the memory cell SX2 in the named order to the drain of the selected memory cell SX1. Furthermore, a circulating current ③ flows from the precharged virtual ground line terminal VG3 through the turned-on transistor BT6 and also through the memory cell SX8, the memory cell SX7, the memory cell SX6, the memory cell SX5, the memory cell SX4, the memory cell SX3 and the memory cell SX2 in the named order to the drain of the selected memory cell SX1.

In this case, since the circulating current ③ from the precharged virtual ground line terminal VG3 reaches the selected memory cell SX1 after passing the one bank selection transistor BT6 and the seven memory cells SX2 to SX8, the circulating current ③ becomes a slight current and therefore is negligible.

Figure 3:
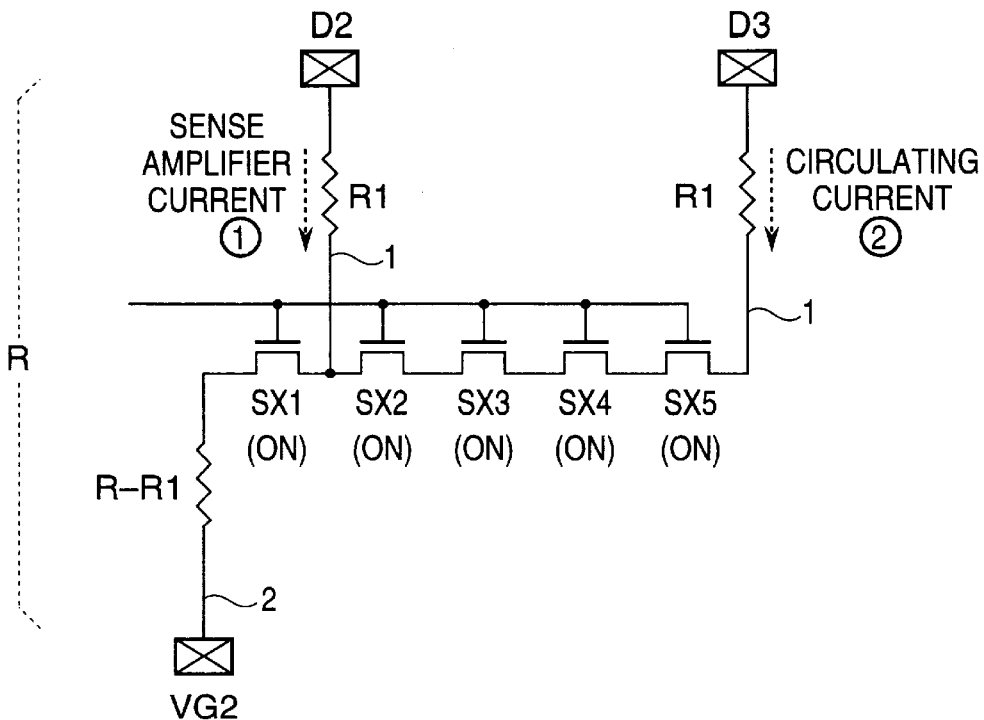
FIG. 3 illustrates a data reading condition in the semiconductor memory shown in FIG. 1.
Figure 8:
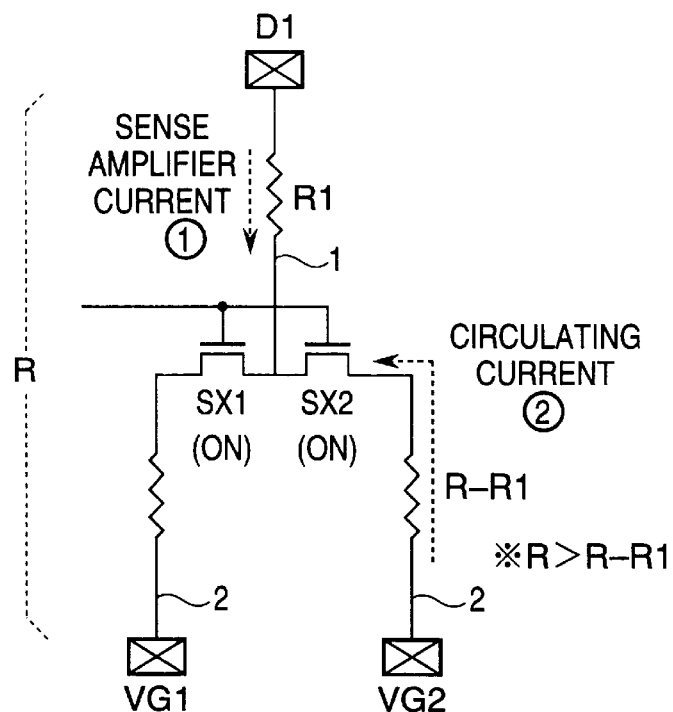
FIG. 8 illustrates a data reading condition in the prior art semiconductor memory shown in FIG. 6.
Figure 4:
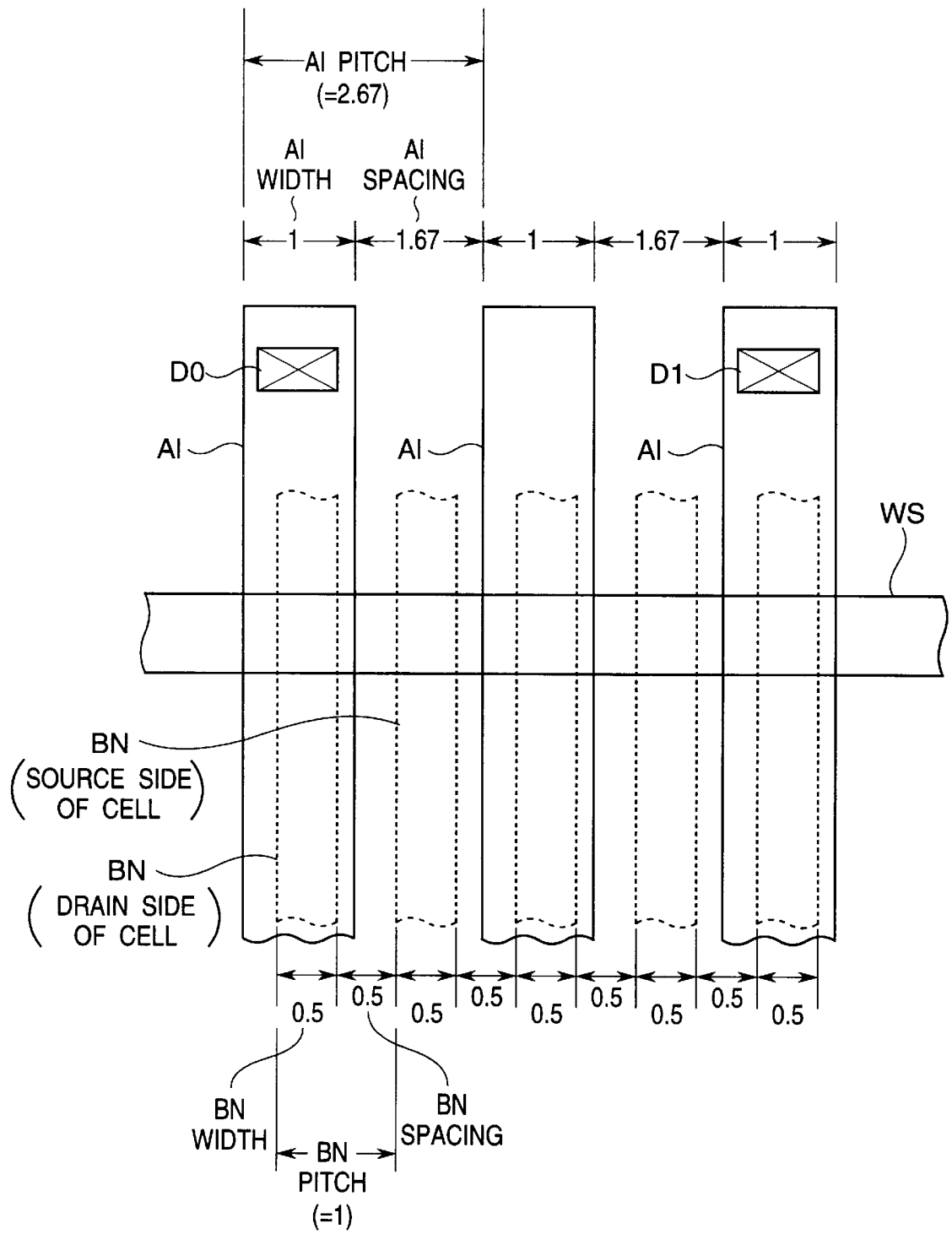
FIG. 4 illustrates a locating condition of bit line diffused interconnections and metal interconnections in the semiconductor memory shown in FIG. 1.

In addition, since the circulating current ② from the precharged bit line terminal D3 reaches the selected memory cell SX1 after passing the one bank selection transistor BT2 and the four memory cells SX2 to SX5 as shown in FIG. 3, the circulating current ② is sufficiently smaller than the sense amplifier current ① flowing from the bit line terminal D2 through the one bank selection transistor BT2 to the selected memory cell SX1, and therefore is also negligible.

Accordingly, the data of the selected memory cell SX1 in the ON condition can be surely read out by the sense amplifier current ①, without influenced by the circulating currents from the precharged sides.

As mentioned above, in the case of reading the data from the memory cell SX1 in the ON condition, it is so configured that the circulating currents from the precharge sides are made negligible even under the worst situation that all the memory cells SX2 to SX8 at the precharge side of the selected memory cell SX1 are in the ON condition, with the result that the data of the selected memory cell can be surely read out by the sense amplifier current.

Figure 6:
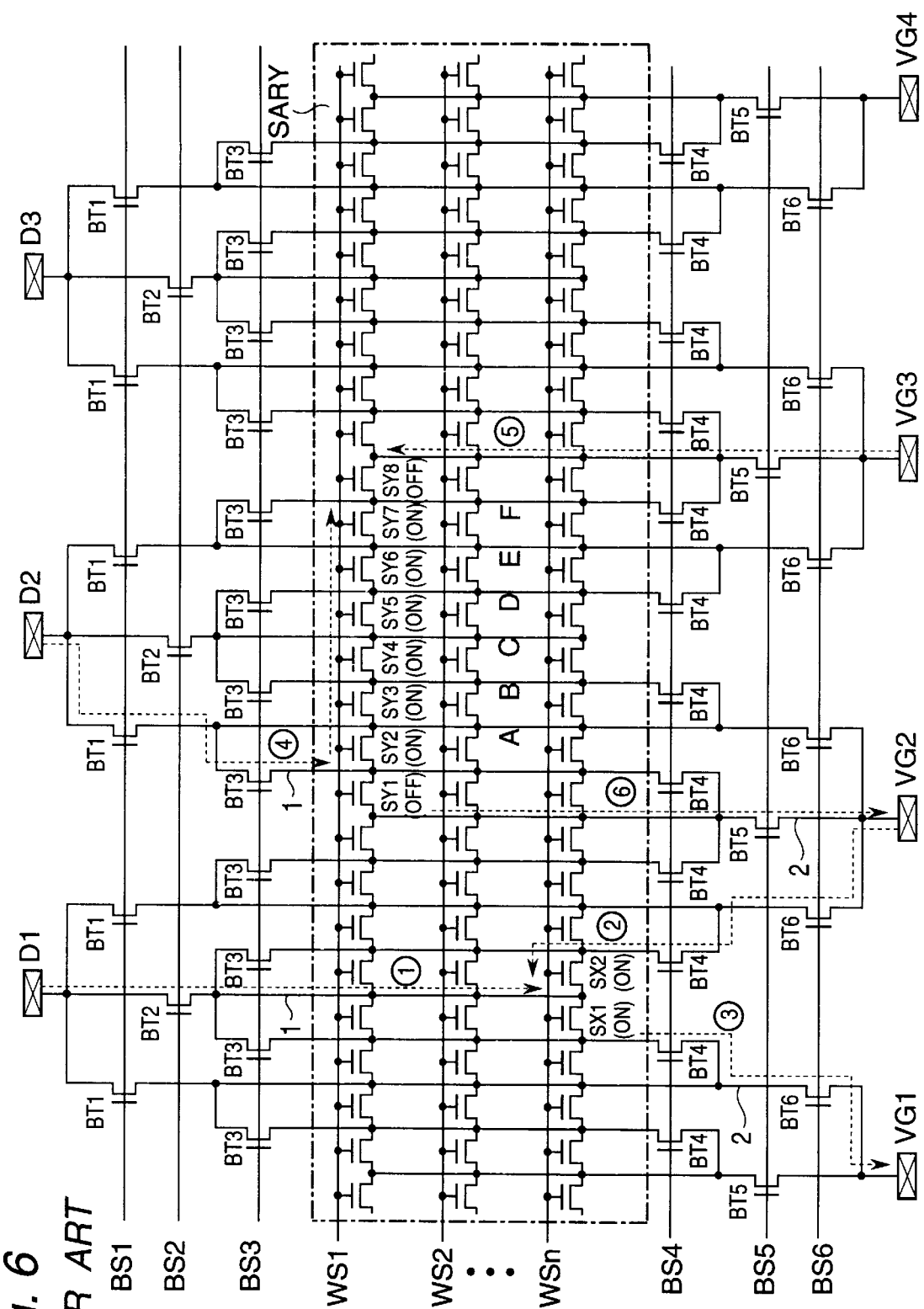
FIG. 6 is a circuit diagram of a first example of the prior art semiconductor memory.

In the first embodiment shown in FIG. 1, the number of the bank selection transistors between the bit line terminal and the virtual ground line terminal can be reduced from the three transistors shown in FIG. 6 (BT2, BT4 and BT6, or BT1, BT3 and BT5) to the two transistors of for example BT2 and BT6, so that an increased sense amplifier current can be supplied to the selected memory cell, and therefore, the data can be surely read out.

In addition, when the memory cell in the ON condition is selected, it is possible to supply a constant sense amplifier current to the selected memory cell independently of the position of the word line connected to the selected memory cell.

Namely, since a precharged source nearest to the bit line (digit line) connected to the sense amplifier for supplying a current to the selected memory cell, is not the virtual ground line connected to the virtual ground line terminal VG, but the bit line connected to the bit line terminal D, the diffused layer resistance ratio between the sense amplifier current ① and the circulating current ② ceaselessly becomes R1: R1, as shown in FIG. 3. Accordingly, even if the selected word line position is remote from the digit line side so that the circulating current becomes maximum, or even if the selected word line position is near to the digit line side so that the circulating current becomes rninimum, the constant sense amplifier current is ceaselessly supplied to the selected memory cell.

The data reading operation for the memory cell SX1 in the ON condition has been described. Now, an operation for reading data from the memory cell SY0 in the OFF condition will be described.

When data is read out from the memory cell SY0 in the OFF condition, as shown in FIG. 1, a sense amplifier current is supplied to the bit line terminal D2 from the sense amplifier, and a corresponding upper side bank selection line BS2 is selected to turn on the bank selection transistors BT2, so that the sense amplifier current ① is supplied to the drain of the selected memory cell SY0. In addition, one row of memory cells including the selected memory cell SY0 are selected by the word line W00. Furthermore, a corresponding lower side bank selection line BS6 is selected to turn on the bank selection transistors BT6, so that data is read out from a source of the selected memory cell SY0 to the virtual ground line terminal VG2. At this time, the bit line terminal D3 and the virtual ground line terminal VG3 positioned at a drain side of the selected memory cell SY0 have been precharged, similarly to the above mentioned example.

Here, assuming that the memory cells SY1, SY2 and SY3 adjacent to the selected memory cell SY0 at the precharge side are in the ON condition and the memory cell SY4 is in the OFF condition, a precharge current ② from the precharged bit line terminal D3 is cut off by the memory cell SY4. Therefore, the sense amplifier current from the bit line terminal D2 charges the memory cells SY1, SY2 and SY3 in the named order of the memory cells SY1, SY2 and SY3.

Since this charging is carried out for three diffused layers "A" to "C", the charging time is shortened remarkably in comparison with the prior art example shown in FIG. 6 in which the six diffused layers "A" to "F" are charged. Therefore, the data can be read out at a high speed.

As mentioned above, when the data of the memory cell SY0 in the OFF condition is read out, it is so configured that even if the precharge current to the memory cells adjacent to the selected memory SY0 is cut off, the number of adjacent memory cells charged by the sense amplifier current is minimized, so that when the sense amplifier current is supplied to the selected memory cell SY0, the time for charging the adjacent memory cells can be shortened, and therefore, the drop of the data reading speed can be suppressed.

Figure 2:
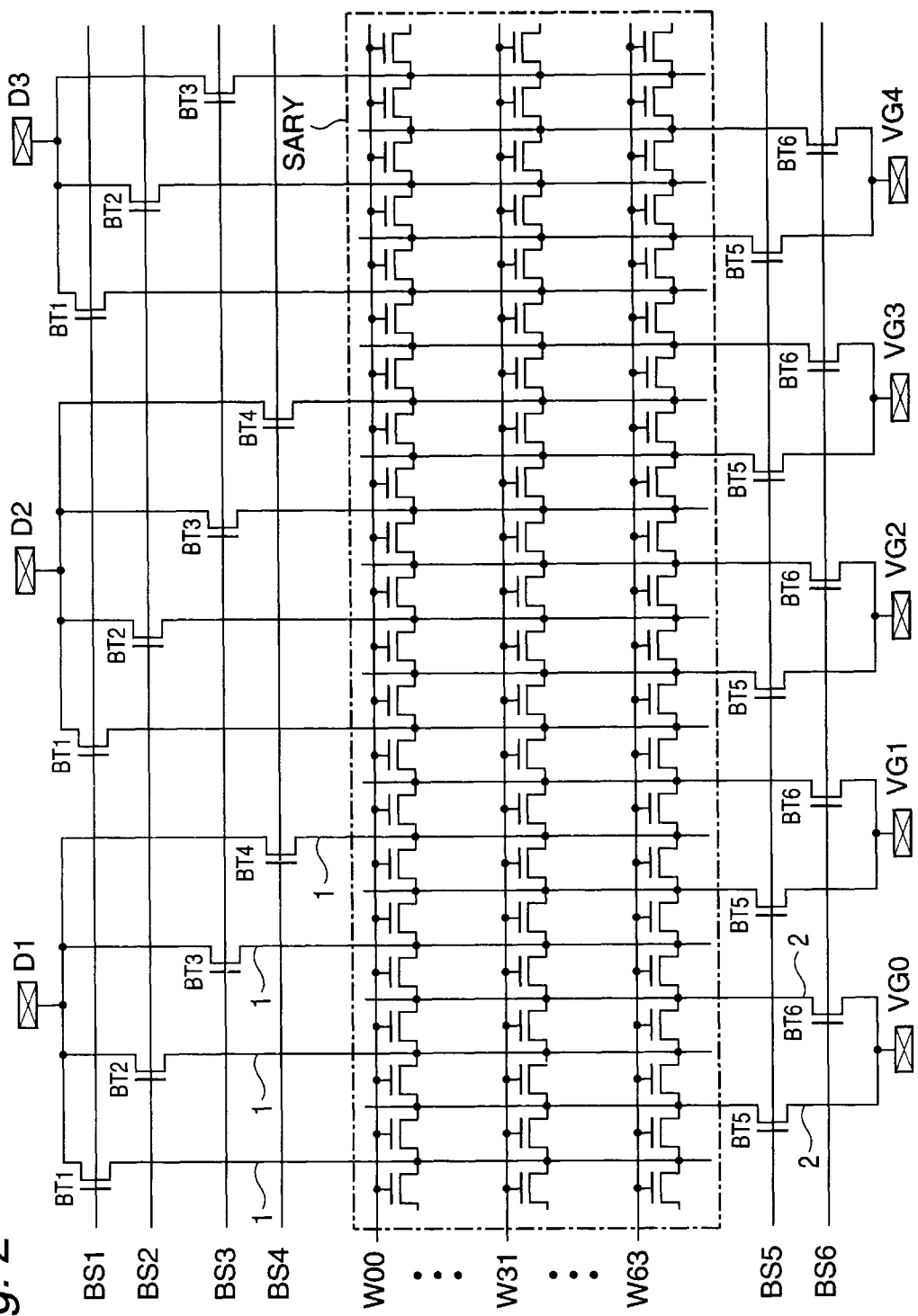
FIG. 2 is a circuit diagram of a second embodiment of the semiconductor memory in accordance with the present invention.

Referring to FIG. 2, there is shown a circuit diagram of a second embodiment of the semiconductor memory in accordance with the present invention. The first embodiment shown in FIG. 1 has a six-stage bank selection line construction in which the two bank selection lines BS1 and BS2 are located at the bit line terminal side of the memory cell array SARY, and die four selection lines BS3 to BS6 are located at the virtual ground line terminal side of the memory cell array SARY. This second embodiment has a six-stage bank selection line construction in which four bank selection lines BS1 to BS4 are located at the bit line terminal side of the memory cell array SARY, and two selection lines BS5 and BS6 are located at the virtual ground line terminal side of the memory cell array SARY.

This construction of the second embodiment can obtain an advantage similar to that obtained in the first embodiment shown in FIG. 1. Namely, when data is read out from the memory cell in the ON condition, the circulating current from the precharge side is minimized, so that the data of the selected memory cell can be surely read out by the sense amplifier current from the bit line terminal D. When data is read out from the memory cell in the OFF condition, the charging time of the adjacent memory cells by the sense amplifier current can be shortened, so that the data can be read out at a high speed.

Figure 5:
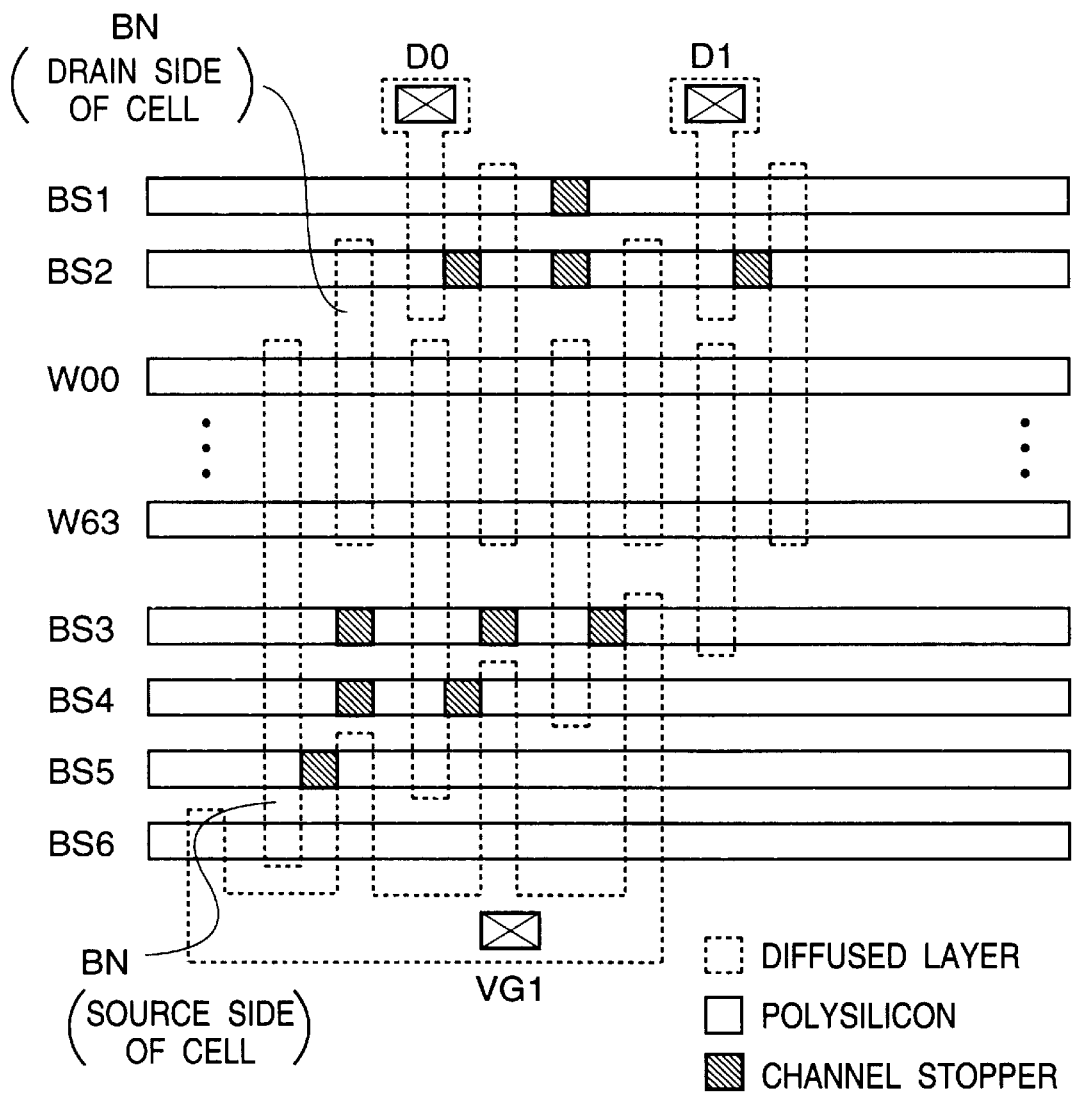
FIG. 5 is a partial layout diagram of the semiconductor memory shown in FIG. 1.

FIG. 5 is a partial layout diagram of the semiconductor memory shown in FIG. 1. In this drawing, the bank selection line BS1 to BS6 and the word lines W00 to W63, depicted by the solid line, are formed of the polysilicon, as mentioned hereinbefore. The gate of each of the memory cells and the bank selection transistors BT1 to BT6 is also formed of the polysilicon.

"BN" depicted by a dotted line, indicates a diffused layer. The drain and the source of each of the memory cells and the bank selection transistors BT1 to BT6 and the bit line diffused interconnections for connecting between the terminals D0, D1 and VG1 and the bank selection transistors and between the bank selection transistors and the memory cells, are formed of the diffused layer, as mentioned hereinbefore.

In the semiconductor memory shown in FIG. 5, two bit line diffused interconnections are formed to be connected to one bit line terminal D and are connected to the drain of the memory cells, and four bit line diffused interconnections are formed to be connected to one virtual ground line terminal VG and are connected to the source of the memory cells. In other words, four bit line diffused interconnections connected to two bit line terminals D0 and D1 are connected to the drain of the memory cells in the respectively corresponding columns (four column pairs), and four bit line diffused interconnections connected to one virtual ground line terminal VG0 are connected to the source of the memory cells in the respectively corresponding columns (four column pairs).

Figure 7:
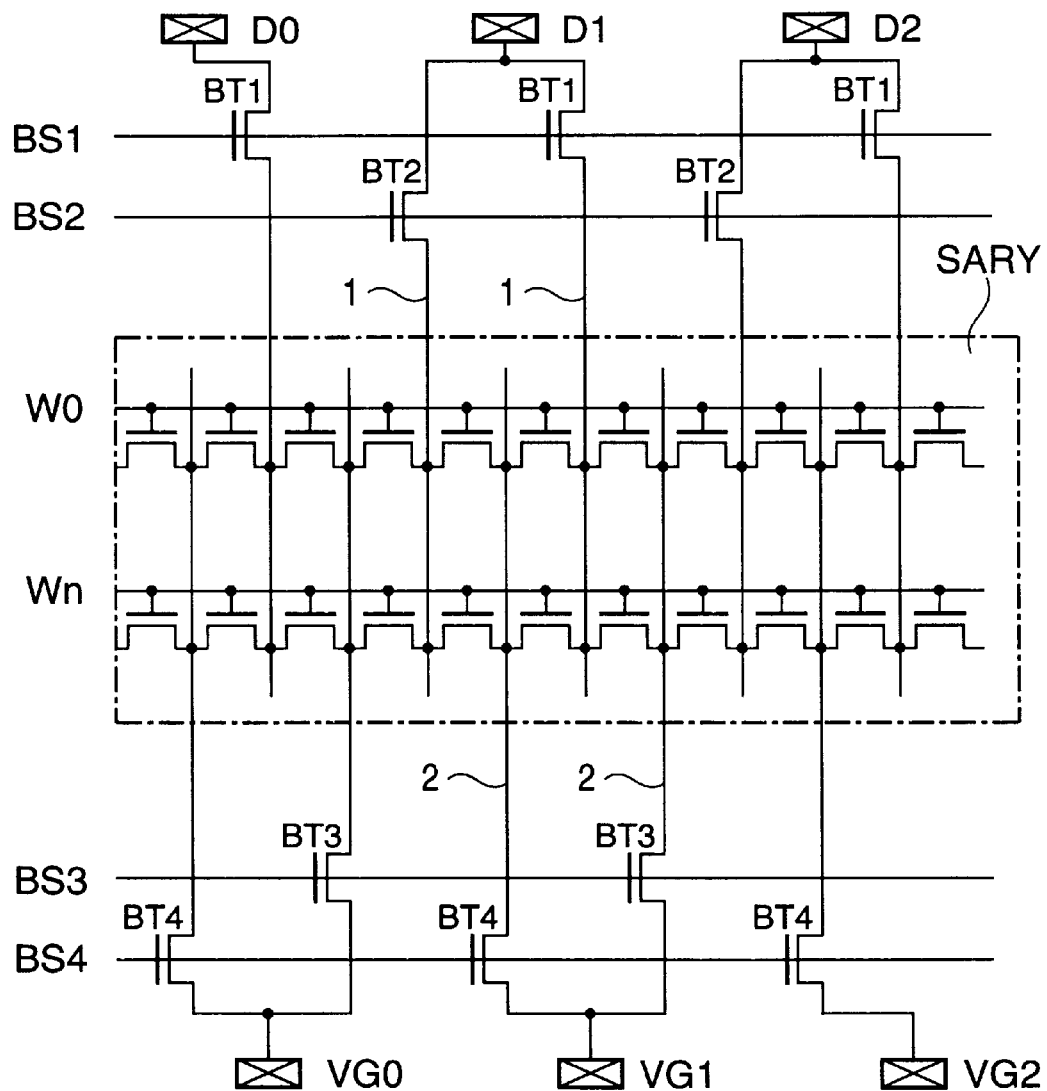
FIG. 7 is a circuit diagram of a second example of the prior art semiconductor memory.

Therefore, although the two aluminum interconnections are connected to the bit line terminals D0 and D1 and located in the same direction as that of the diffused layer BN, it is sufficient if only one aluminum interconnection of the virtual ground line terminal VG is located in the same direction as that of the diffused layer BN. Accordingly, it is sufficient if only three aluminum interconnections are provided for each eight diffused layers BN in the same direction as that of the diffused layers BN. Therefore, the aluminum interconnections can be located with a sufficient margin, in comparison with the prior art example shown in FIG. 7 in which one aluminum interconnection is required for each of the bit line terminals and the virtual ground line terminals, namely, for each two diffused layers.

Figure 9:
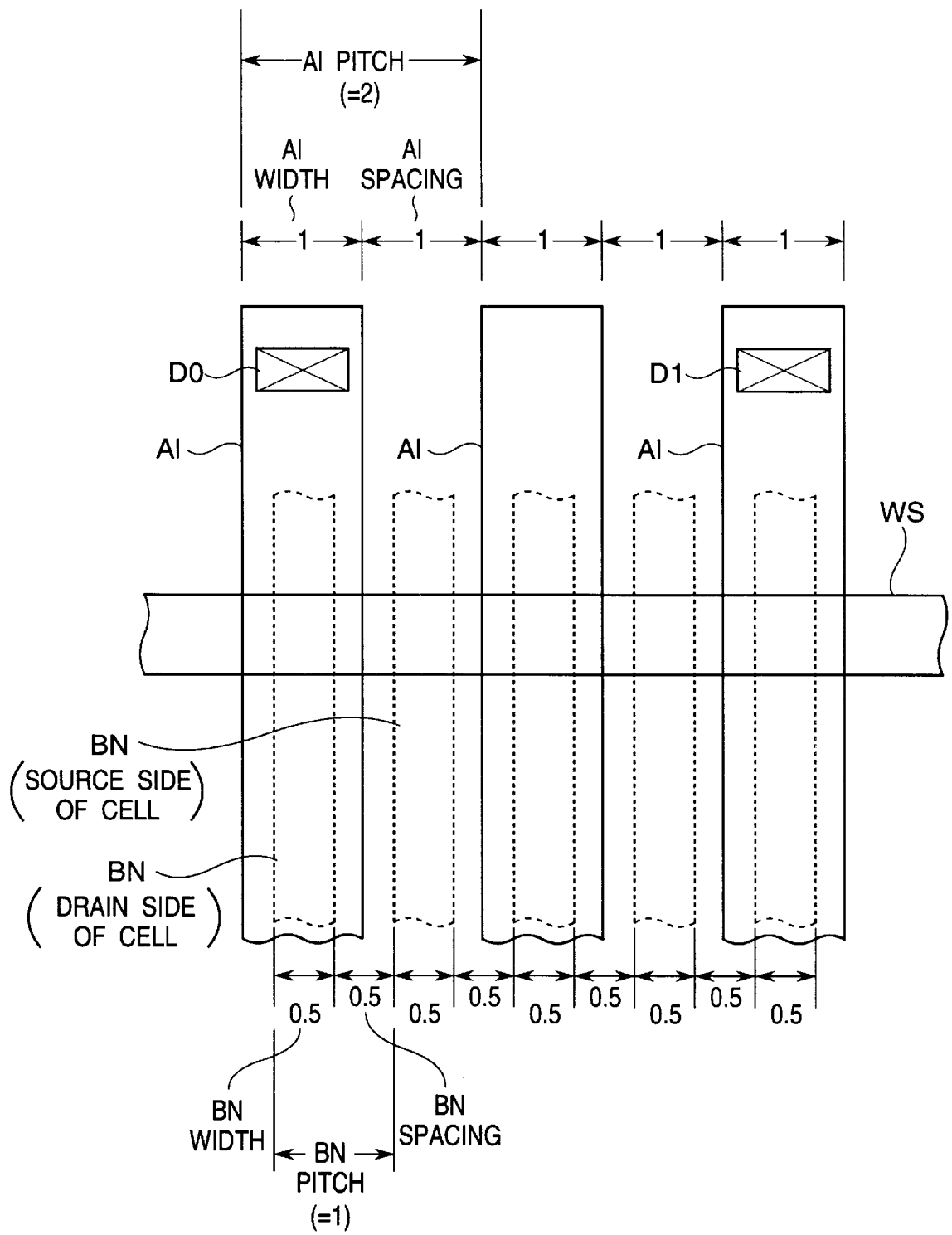
FIG. 9 illustrates a locating condition of bit line diffused interconnections and metal interconnections in the prior art semiconductor memory shown in FIG. 7.

Accordingly, in the embodiment of the semiconductor memory, if the integration density is elevated so that the locating pitch of the diffused layer BN becomes the minimum value of 1 $\mu$m, it is possible to make the locating pitch of the aluminum interconnection Al to 2.67 $\mu$m. Therefore, the embodiment can have a tolerance in the locating pitch of the aluminum interconnection Al, in comparison with the prior art example shown in FIG. 7 and FIG. 9. In other words, even if the integration density is elevated, it is possible to easily locate and pattern the metal interconnection such as the aluminum interconnection.

Incidentally, in the semiconductor memory shown in FIG. 2, it is sufficient if only one aluminum interconnection is provided for the bit line terminal D1 while the two aluminum lines are provided for the virtual ground line terminals VG0 and VG1. Therefore, an advantage similar to that obtained in the first embodiment can be obtained in the second embodiment.

In the above mentioned embodiments, the memory cell array SARY is selected by the six bank selection lines BS1 to BS6. However, it is possible to provide 12 bank selection lines BS1 to BS12 for one memory cell array in such a manner that a memory cell selection at the bit line terminal side are carried out by four bank selection lines BS1 to BS4, and a memory cell selection at the virtual ground line terminal side are carried out by the remaining eight bank selection lines BS5 to BS12. In this case, it is a matter of course that it is also possible to carry out a memory cell selection at the bit line terminal side by eight bank selection lines BS1 to BS8, and to carry out a memory cell selection at the virtual ground line terminal side by the remaining four bank selection lines BS9 to BS12. Furthermore, it is possible to provide 24 bank selection lines BS1 to BS24 for one memory cell array in such a manner that a memory cell selection at the bit line terminal side are carried out by eight bank selection lines BS1 to BS8, and a memory cell selection at the virtual ground line terminal side are carried out by the remaining 16 bank selection lines BS9 to BS24. In this case, it is also a matter of course that it is possible to carry out a memory cell selection at the bit line terminal side by 16 bank selection lines BS1 to BS16, and to carry out a memory cell selection at the virtual ground line terminal side by the remaining eight bank selection lines BS17 to BS24.

In addition, it is possible to provide 9 bank selection lines BS1 to BS9 for one memory cell array in such a manner that a memory cell selection at the bit line terminal side are carried out by three bank selection lines BS1 to BS3, and a memory cell selection at the virtual ground line terminal side are carried out by the remaining six bank selection lines BS4 to BS9. In this case, it is a matter of course that it is also possible to carry out a memory cell selection at the bit line terminal side by six bank selection lines BS1 to BS6, and to carry out a memory cell selection at the virtual ground line terminal side by the remaining three bank selection lines BS7 to BS9.

As mentioned above, the semiconductor memory in accordance with the present invention is characterized in that the number of the first sub-bit lines connected to one bit line terminal and connected to the drain (one electrode) of the memory cells in the memory cell array, is made different from the number of the second sub-bit lines connected to one ground line terminal and connected to the source (the other electrode) of the memory cells in the memory cell array. With this arrangement, when data is read out from the selected memory cell in the ON condition, even under the worst condition in which all the memory cells at the precharge side of the selected memory cell are in the ON condition, it is possible to minimize the circulating current from the precharge side, and therefore, the data of the selected memory cell can be surely read out by the sense amplifier current. On the other hand, when data is read out from the selected memory cell in the OFF condition, the time for charging the adjacent memory cell by the sense amplifier current can be shortened, so that the data can be read out at a high speed.

For the bit line terminals and the ground line terminals, it is not necessary to provide one metal interconnection for each two diffused layers. Therefore, when the integration density is elevated, the locating pitch of the metal interconnection such as the aluminum interconnection connected to each line terminal can have a tolerance, and therefore, it becomes easy to locate and pattern the metal interconnection.

In addition, since each of the first sub-bit lines is connected to a corresponding one of the bit line terminals through only one bank selection transistor, and since each of the second sub-bit lines is connected to a corresponding one of the ground line terminals through only one bank selection transistor, it is possible to supply an increased sense amplifier current to the selected memory cell. Therefore, the data can be surely read out.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory comprising:

a memory cell array including a number of memory cells formed of MOS transistors and located in the form of a matrix;

a plurality of bit line terminals for supplying a sense amplifier current to one electrode of a pair of electrodes of each of the memory cells arranged in a column direction;

a plurality of ground line terminals for reading data from the other electrode of each of the memory cells arranged in a column direction;

a plurality of word lines each connected in common to gates of the memory cells arranged in a row direction;

a plurality of first sub-bit lines connected to said bit line terminals and individually connected to the one electrode of the memory cells;

a plurality of second sub-bit lines each connected to said ground line terminals and individually connected to the other electrode of the memory having the one electrode connected to said first sub-bit lines; and a plurality of bank selection transistors connected between said bit line terminals and said ground line terminals and said first sub-bit lines and said second sub-bit lines, and selectively turned on by bank selection signals, the number of said first sub-bit lines connected to one of said bit line terminals being different from the number of said second sub-bit lines connected to one of said ground line terminals.

2. A semiconductor memory claimed in claim 1 wherein the number of said first sub-bit lines connected to one of said bit line terminals is a double of the number of said second sub-bit lines connected to one of said ground line terminals.

3. A semiconductor memory claimed in claim 1 wherein the number of said first sub-bit lines connected to one of said bit line terminals is a half of the number of said second sub-bit lines connected to one of said ground line terminals.

4. A semiconductor memory claimed in claim 1 wherein each of said first sub-bit lines is connected to a corresponding one of said bit line terminals through only one bank selection transistor, and each of said second sub-bit lines is connected to a corresponding one of said ground line terminals through only one bank selection transistor.

5. A semiconductor memory claimed in claim 1 wherein said first and second sub-bit lines, the one electrode and the other electrode of each of said memory cells, and one electrode and the other electrode of each of said bank selection transistors are formed of a diffused layer, the gate of each of said memory cells and said bank selection transistors, bank selection lines connected to the gates of said bank selection transistors and said word lines are formed of a polysilicon.

6. A semiconductor memory claimed in claim 1 wherein bit lines and ground lines connected to said bit line terminals and said ground line terminals, respectively, are formed of a metal interconnection.

* * * * *

UNITED STATES PATENT AND TRADEMARK OFFICE
CERTIFICATE OF CORRECTION

PATENT NO. : 6,081,474
DATED : June 27, 2000
INVENTOR(S) : Tetsuji TOGAMI, Kazuteru SUZUKI It is certified that error appears in the above-indentified patent and that said Letters Patent is hereby corrected as shown below:

Column 2, line 15, delete " " insert -- --.

Column 4, line 3, delete "sub-it" insert --sub-bit--.

Signed and Sealed this

Seventeenth Day of April, 2001

*Attest:*

NICHOLAS P. GODICI

*Attesting Officer*    *Acting Director of the United States Patent and Trademark Office*